United States Patent
Granot (10) Patent No.: US 11,244,474 B1
(45) Date of Patent: Feb. 8, 2022

(54) SAMPLE POSITIONING SYSTEM AND METHOD

(71) Applicant: KLA Corporation, Milpitas, CA (US)

(72) Inventor: Asaf Granot, Lotem (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/060,473

(22) Filed: Oct. 1, 2020

(51) Int. Cl.
| | |
|---|---|
| *G06T 7/73* | (2017.01) |
| *H04N 5/235* | (2006.01) |
| *H04N 5/355* | (2011.01) |
| *G06T 7/80* | (2017.01) |
| *G06T 7/70* | (2017.01) |
| *G06T 7/77* | (2017.01) |
| *H04N 5/232* | (2006.01) |
| *G01N 21/95* | (2006.01) |

(52) U.S. Cl.
CPC .............. *G06T 7/74* (2017.01); *G06T 7/70* (2017.01); *G06T 7/73* (2017.01); *G06T 7/77* (2017.01); *G06T 7/80* (2017.01); *H04N 5/2353* (2013.01); *H04N 5/23299* (2018.08); *H04N 5/35563* (2013.01); *G01N 21/9501* (2013.01); *G01N 21/9505* (2013.01)

(58) Field of Classification Search
CPC .... G06T 7/70; G06T 7/73; G06T 7/74; G06T 7/77; G06T 7/80; G01N 21/9501; G01N 21/9505; H04N 5/23299
See application file for complete search history.

(56) References Cited

U.S. PATENT DOCUMENTS

| 10,684,563 B2 | 6/2020 | Manassen et al. |
| 2005/0104017 A1 | 5/2005 | Kimba et al. |
| 2008/0075380 A1* | 3/2008 | Dube .................... G06T 7/0012 |
| | | 382/255 |

(Continued)

FOREIGN PATENT DOCUMENTS

| JP | 2016148701 A | 8/2016 |
| JP | 2016219659 A | 12/2016 |

OTHER PUBLICATIONS

McCloskey, Scott, Honeywell ACS Labs, "Velocity-Dependent Shutter Sequences for Motion Deblurring", Printed Jul. 7, 2020, 14 pages.

(Continued)

*Primary Examiner* — David N Werner
(74) *Attorney, Agent, or Firm* — Suiter Swantz pc llo (57) ABSTRACT

A sample positioning system is disclosed. The system may include an imaging detector. The system may further include a controller communicatively coupled to the imaging detector and a sample stage, the controller including one or more processors configured to execute program instructions causing the one or more processors to: receive a current position of a field of view of the imaging detector; receive a target position of the sample; receive locations of reference features along a path; direct the sample stage to translate the sample along the path; direct the imaging detector to capture images of the reference features along the path; determine positioning errors of the sample stage along the path based on the images of the reference features; and adjust at least one of a velocity of the sample stage or the path to the target location based on the positioning errors during translation.

40 Claims, 7 Drawing Sheets

(56) References Cited

U.S. PATENT DOCUMENTS

| | | | |
|---|---|---|---|
| 2011/0063435 A1* | 3/2011 | Seko | G01B 11/002 |
| | | | 348/135 |
| 2013/0250095 A1 | 9/2013 | Inoue et al. | |
| 2018/0038805 A1* | 2/2018 | Heikkila | G01S 17/06 |
| 2019/0310080 A1 | 10/2019 | Hill et al. | |
| 2020/0125883 A1* | 4/2020 | Yasunaga | G06Q 10/087 |
| 2020/0252604 A1* | 8/2020 | Schneider | H04N 17/002 |
| 2020/0302642 A1* | 9/2020 | Hashimoto | H04N 5/23299 |
| 2020/0348128 A1* | 11/2020 | Sasa | G06T 7/001 |
| 2020/0402254 A1* | 12/2020 | Murawska | G01B 11/165 |
| 2021/0281829 A1* | 9/2021 | Kimpe | H04N 17/002 |

OTHER PUBLICATIONS

Yitzhaky Y, et al. "Direct method for restoration of motion-blurred images." J. Opt. Soc. Am. A, vol. 15, No. 6 (Jun. 1998), pp. 1512-1519.

PCT International Search Report and Written Opinion for International Application No. PCT/US2020/056733 dated Jul. 1, 2021, 7 pages.

* cited by examiner

SAMPLE POSITIONING SYSTEM AND METHOD

TECHNICAL FIELD

The present invention generally relates to characterization systems, and, more particularly, to a sample positioning system and method for characterization systems.

BACKGROUND

As the demand for ever-shrinking semiconductor devices increases, so too does the demand for accurate and efficient characterization tools. Characterization tools typically generate characterization data associated with a sample by measuring or otherwise inspecting dedicated targets distributed across the sample. Some tools may be designed to inspect a target while the target is static within a field of view. Such tools may thus inspect multiple targets across a sample using a move-acquire-measure (MAM) mode operation. During the move step, the sample is translated to place a target of interest within a measurement field of view. During the acquire step, information about the target's focus position is acquired and a corrective motion is made to bring the target into focus. During the measure step, a measurement is taken while the sample is static, and the sample is then translated to place an additional target of interest in the measurement field of view. Other characterization tools may be designed to inspect a target while the sample is in motion (e.g., a scanning mode of operation). However, these characterization tools may provide inefficient characterization of targets distributed across the sample.

Therefore, it would be desirable to provide a system and method that cure the shortfalls of the previous approaches identified above.

SUMMARY

A sample positioning system is disclosed, in accordance with one or more embodiments of the present disclosure. In one embodiment, the system includes an imaging detector. In another embodiment, the system includes a controller communicatively coupled to the imaging detector and a sample stage, the controller including one or more processors configured to execute program instructions causing the one or more processors to: receive a current position of a field of view of the imaging detector on a sample mounted to the sample stage; receive a target position of the sample for imaging with the imaging detector; receive locations of one or more reference features along a path between the current position and the target position; direct the sample stage to translate the sample along the path; direct the imaging detector to capture one or more images of the one or more reference features along the path; determine positioning errors of the sample stage along the path based on the one or more images of the one or more reference features; and adjust at least one of a velocity of the sample stage or the path to the target location based on the positioning errors during translation, wherein a positioning accuracy of the sample stage at the target position is based on a resolution of the imaging detector.

A characterization system is disclosed, in accordance with one or more embodiments of the present disclosure. In one embodiment, the system includes an imaging detector. In another embodiment, the system includes a sample stage for securing a sample. In another embodiment, the system includes a controller communicatively coupled to the imaging detector and the sample stage, the controller including one or more processors configured to execute program instructions causing the one or more processors to: receive a current position of a field of view of the imaging detector on the sample mounted to the sample stage; receive a target position of the sample for imaging with the imaging detector; receive locations of one or more reference features along a path between the current position and the target position; direct the sample stage to translate the sample along the path; direct the imaging detector to capture one or more images of the one or more reference features along the path; determine positioning errors of the sample stage along the path based on the one or more images of the one or more reference features; and adjust at least one of a velocity of the sample stage or the path to the target location based on the positioning errors during translation, wherein a positioning accuracy of the sample stage at the target position is based on a resolution of the imaging detector.

A sample positioning method is disclosed, in accordance with one or more embodiments of the present disclosure. In one embodiment, the method includes receiving a current position of a field of view of an imaging detector on a sample mounted to a sample stage. In another embodiment, the method includes receiving a target position of the sample for imaging with the imaging detector. In another embodiment, the method includes receiving locations of one or more reference features along a path between the current position and the target position. In another embodiment, the method includes directing the sample stage to translate the sample along the path. In another embodiment, the method includes directing the imaging detector to capture one or more images of the one or more reference features along the path. In another embodiment, the method includes determining positioning errors of the sample stage along the path based on the one or more images of the one or more reference features. In another embodiment, the method includes adjusting at least one of a velocity of the sample stage or the path to the target location based on the positioning errors during translation, wherein a positioning accuracy of the sample stage at the target position is based on a resolution of the imaging detector.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Some characterization tools may be designed to inspect a target while the target is static within a field of view. A static mode may consist of translating the sample until a target is placed within a measurement field of view, waiting for the position of the sample to settle, performing a measurement (e.g., generating an image, or the like), translating the sample to place a new target within the measurement field of view, and repeating the process. This is time consuming because the location correction requires time for stage settling, image acquisition, image processing and stage location correction. Further, the final position is based on a single image acquired for navigation correction, which is subject to substantial error due to miscalculation statistics.

Referring generally to FIGS. 1A-4, a sample positioning system and method is described, in accordance with one or more embodiments of the present disclosure.

Embodiments of the present disclosure are directed to a sample positioning system and method using a sample as a large-scale encoder to teach the system the route to a target. For example, one or more images of the sample may be used as closed loop feedback to adjust one or more correctables of the sample positioning system based on positioning errors of the sample stage. For instance, the velocity of the sample stage and/or the path to a target location may be adjusted based on the positioning errors of the sample stage while the sample stage is on-route (e.g., while the sample stage is moving). It is noted herein that shifting the encoder from the stage to the sample allows navigation accuracy to be based on the resolution of the imaging detector of the sample positioning system, rather than depending on external calibrations of the stage. This results in higher final accuracy of positioning. The sample positioning system allows for faster navigation processing and does not require real-time overhead for image acquisition or stage movement corrections.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable.

Figure 1A:
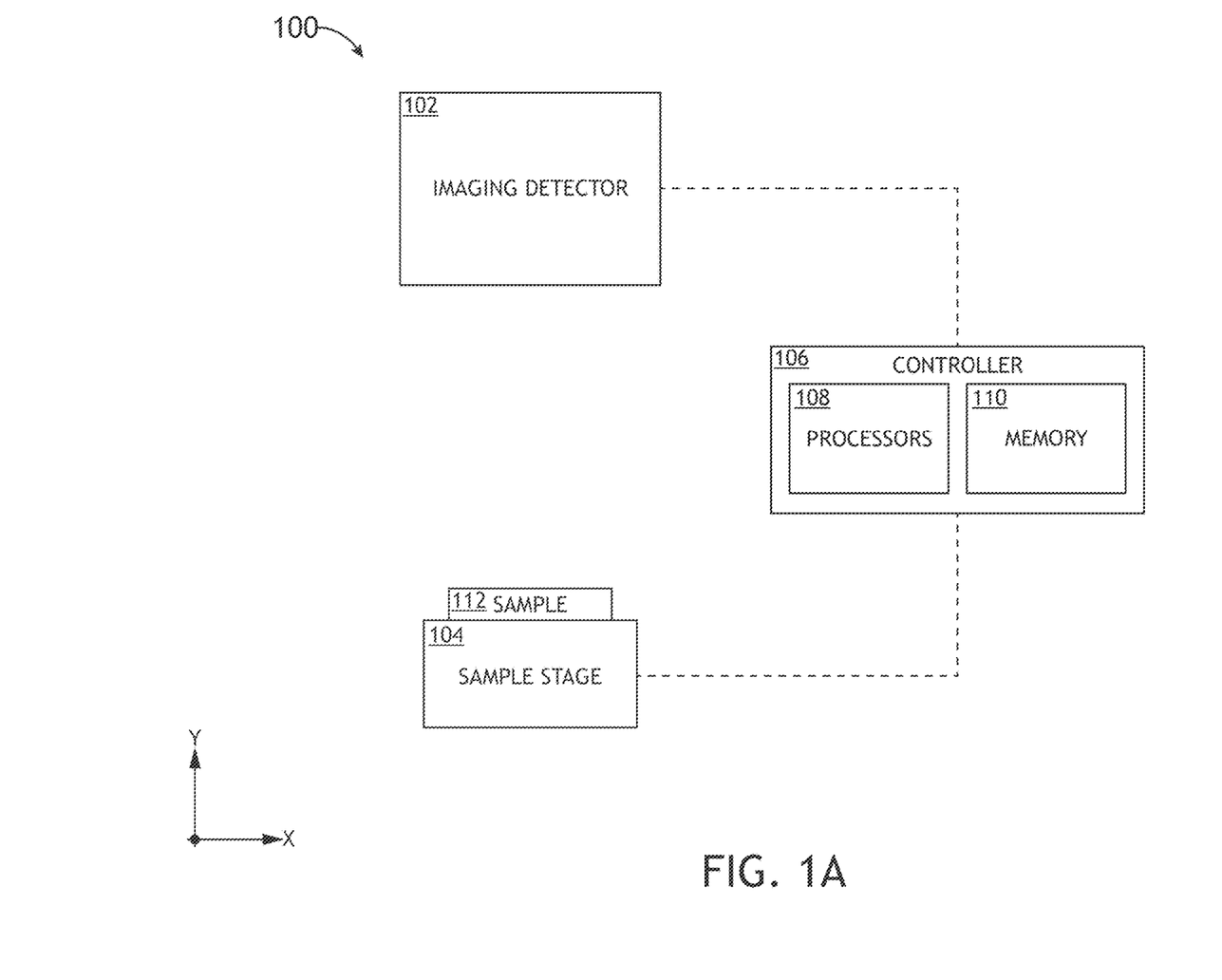
FIG. 1A illustrates a simplified block diagram of a sample positioning system, in accordance with one or more embodiments of the present disclosure.

FIG. 1A illustrates a simplified block diagram of a sample positioning system 100, in accordance with one or more embodiments of the present disclosure.

In one embodiment, the sample positioning system 100 includes an imaging detector 102 configured to capture one or more images of a sample mounted on a sample stage 104. For example, the imaging detector 102 may be configured to capture the one or more images of the sample at a target location when the sample is stationary. By way of another example, the imaging detector 102 may be configured to capture the one or more images of the sample at a target location when the sample is in motion (e.g., while the sample is on-route).

In another embodiment, the imaging detector 102 includes a fast camera configured to capture one or more images of the sample. For example, the imaging detector 102 may include a fast frame rate camera 102. By way of another example, the imaging detector 102 may include a fast differential camera 102.

In another embodiment, the sample positioning system 100 includes a lighting sub-system. The lighting sub-system may include an illumination source and illumination optics. The illumination source of the lighting sub-system may include any illumination source known in the art suitable for generating an illumination beam that will interact with the sample 112. For example, the lighting sub-system may be configured to allow a select amount of light in for image acquisition. In one instance, the exposure time of the imaging detector 102 may be less than 2 milliseconds (ms). In another instance, the exposure time of the imaging detector 102 may be less than 1 ms. In a further instance, the exposure time of the imaging detector 102 may be less than 0.05 ms. In this regard, the select amount of light (e.g., the exposure time of the imaging detector 102) may result in high quality images and allow for quantitative image processing.

In another embodiment, the sample positioning system 100 includes a sample stage 104 configured to translate a sample 112 mounted on the sample stage 104 in the x- and/or y-direction. It is noted herein that the sample stage 104 may be configured to translate the sample 112 mounted on the sample stage 104 in the x- and/or y-direction at a select velocity. For example, the sample stage 104 may be configured to translate the sample 112 mounted to the sample stage 104 at a velocity greater than 500 micrometers per second (μm/s). By way of another example, the sample stage 104 may be configured to translate the sample 112 mounted to the sample stage 104 at a velocity greater than 900 μm/s.

In some embodiments, the sample stage 104 is configured to translate the sample 112 mounted on the sample stage 104 in a first direction (e.g., in the x- or y-direction) before translating the sample 112 mounted on the sample stage 104 in a second direction (e.g., in the x- or y-direction), wherein the second direction is different than the first direction. For example, the sample stage 104 may translate the sample 112 mounted on the sample stage 104 in the x-direction a select amount before translating the sample 112 mounted on the sample stage 104 in the y-direction. By way of another example, the sample stage 104 may translate the sample 112 mounted on the sample stage 104 in the y-direction a select amount before translating the sample 112 mounted on the sample stage 104 in the x-direction. The movement in the x-direction may be a shorter distance than the movement in the y-direction, and vice versa, such that the sample positioning system is configured to finish the shorter movement first.

In another embodiment, the sample 112 mounted on the sample stage 104 may include one or more reference features. For example, the one or more reference features may include one or more sets of periodic features oriented with a periodicity along a path of the sample 112.

In one embodiment, the sample positioning system 100 includes one or more controllers 106 including one or more processors 108 and memory 110. For example, the one or more processors 108 may be configured to execute a set of program instructions maintained in a memory device 110 (memory 110). The one or more processors 108 of the one or more controllers 106 may include any processing element known in the art. In this sense, the one or more processors 108 may include any microprocessor-type device configured to execute algorithms and/or instructions. Further, the memory device 110 may include any storage medium known in the art suitable for storing program instructions executable by the associated one or more processors 108. For example, the memory device 110 may include a non-transitory memory medium. As an additional example, the memory device 110 may include, but is not limited to, a read-only memory, a random access memory, a magnetic or optical memory device (e.g., disk), a magnetic tape, a solid state drive and the like.

In another embodiment, the one or more controllers 106 are configured to generate one or more processed images of the sample. For example, the one or more controllers 106 may include an image processing controller 106a configured to generate the one or more processed images of the sample.

Figure 1B:
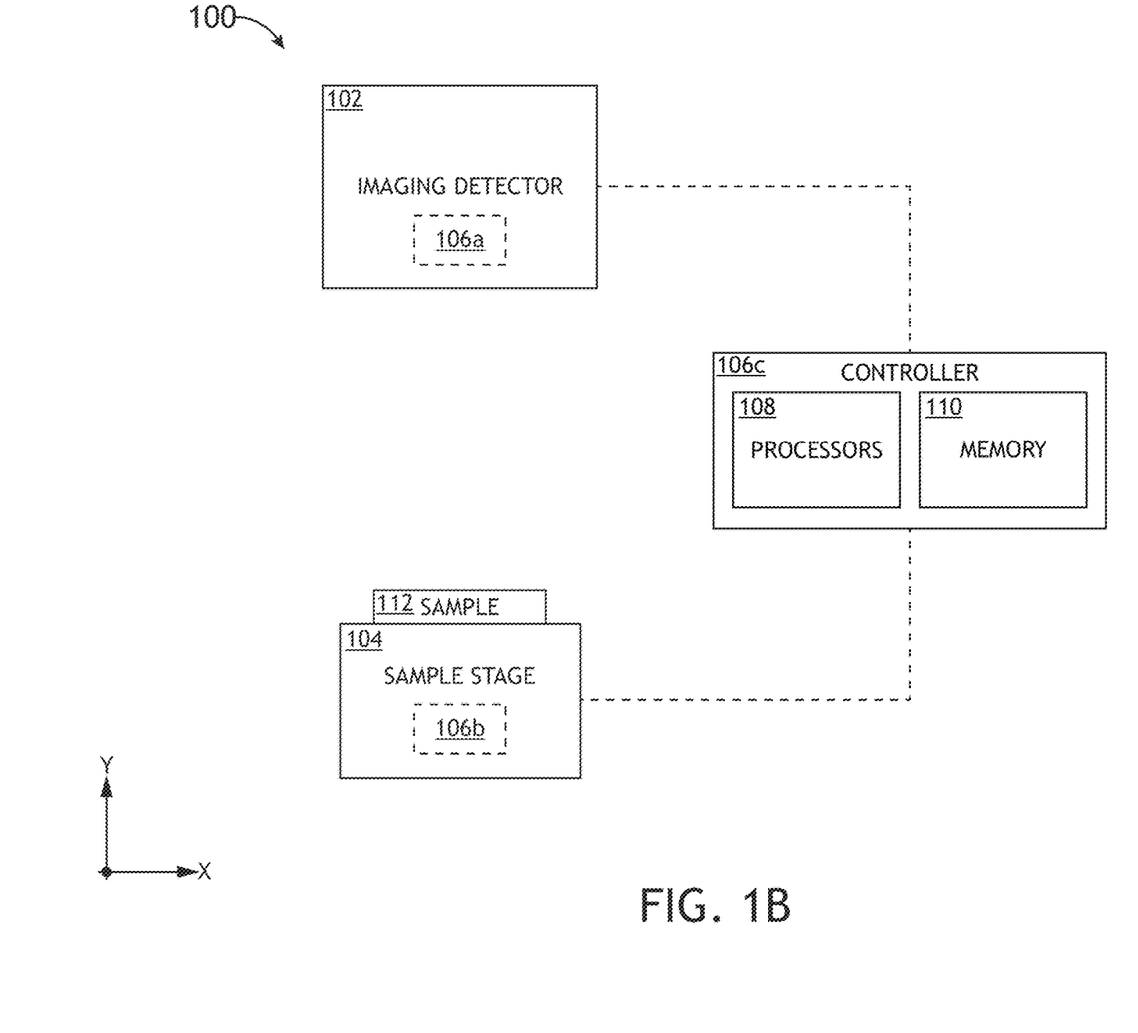
FIG. 1B illustrates a simplified block diagram of a sample positioning system, in accordance with one or more embodiments of the present disclosure.
Figure 1C:
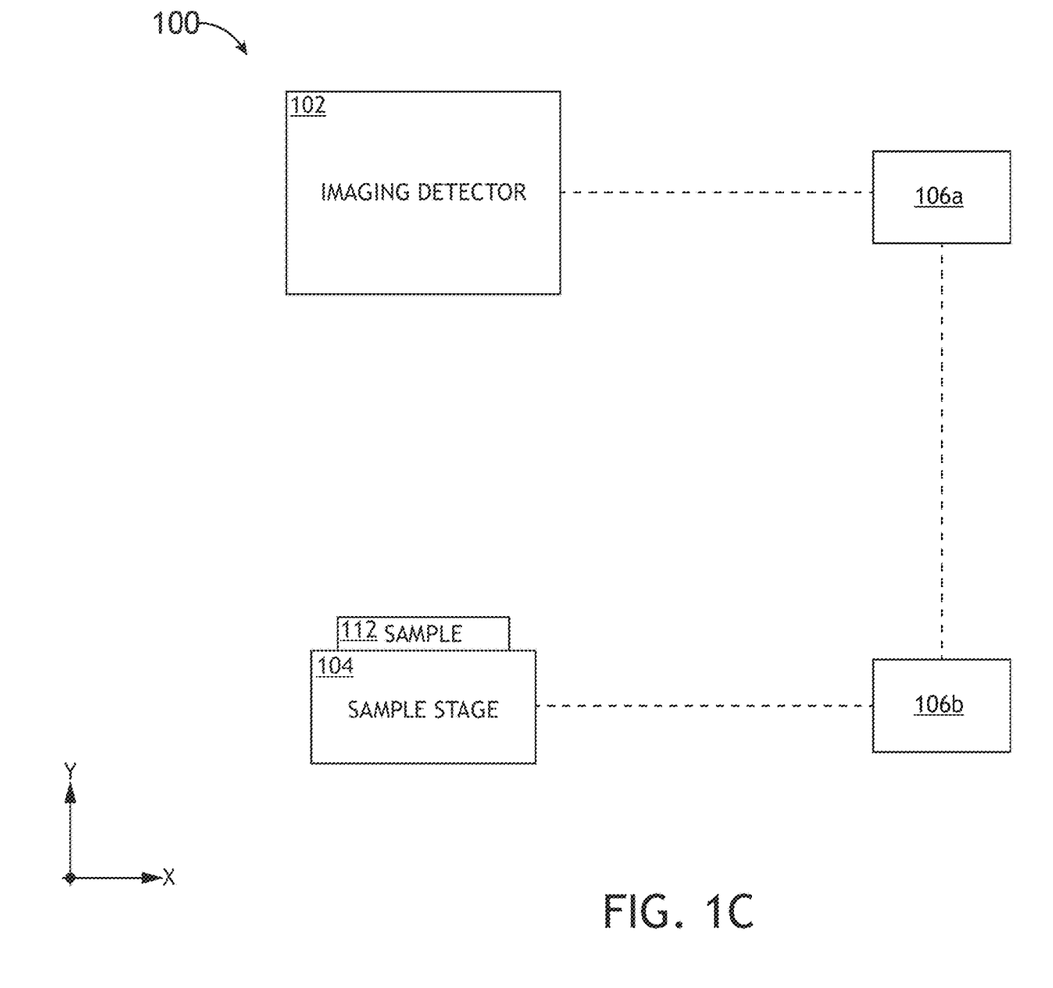
FIG. 1C illustrates a simplified block diagram of a sample positioning system, in accordance with one or more embodiments of the present disclosure.

In another embodiment, the imaging detector 102 is configured to communicatively couple to the image processing controller 106a. For example, as shown in FIG. 1B, the imaging detector 102 may be configured to couple to an on-board image processing controller 106a. For instance, the on-board image processing controller 106a may be integrated into the imaging detector 102. By way of another example, as shown in FIG. 1C, the imaging detector 102 may be configured to couple to an off-board image processing controller 106a. For instance, the off-board image processing controller 106a may be external to the imaging detector 102. In this regard, the imaging detector 102 may be configured to couple to an off-board image processing controller 106a with low latency, such that the off-board image processing controller 106a may be configured to process a high volume of images. It is noted herein that the off-board image processing controller 106a may be configured to perform various functions beyond image processing.

In one embodiment, the one or more controllers 106 are configured to correct a position of the sample stage 104. For example, the one or more controllers 106 may include a sample positioning controller 106b configured to correct a position of the sample stage 104.

In another embodiment, the sample stage 104 is configured to communicatively couple to the sample positioning controller 106b. For example, as shown in FIG. 1B, the sample stage 104 may be configured to couple to a sample positioning controller 106b on-board the sample stage 104. For instance, the sample positioning controller 106b may be integrated into the sample stage 104. By way of another example, as shown in FIG. 1C, the sample stage 104 may be configured to communicatively couple to a sample positioning controller 106b off-board the sample stage 104. For instance, the sample positioning controller 106b may be external to the sample stage 104. In this regard, the off-board sample positioning controller 106b may be designated only for sample positioning correction purposes. In another regard, the off-board sample positioning controller 106b may be used for at least sample positioning correction purposes, as well as for other purposes of the sample positioning system.

In one embodiment, the image processing controller 106a is configured to communicatively couple to the sample positioning controller 106b. In another embodiment, the sample positioning controller 106b is configured to communicatively couple to the image processing controller 106a. For example, the image processing controller 106a and the sample positioning controller 106b may be synchronized. For instance, the image processing controller 106a may be configured to receive one or more inputs simultaneously. In this regard, the image processing controller 106a may be configured to receive an image of the sample 112 captured by the imaging detector 102 and a sample stage location ($x_0$, $y_0$) from the sample positioning controller 106b. The image processing controller 106a may then be configured to determine the actual location of the sample stage ($x_{actual}$, $y_{actual}$) and generate one or more vector correction signals ($d_x$, $d_y$) to send to the sample positioning controller 106b to adjust the location of the sample stage 104 while in movement.

In some embodiments, the one or more controllers 106 include a master controller 106c configured to couple to the image processing controller 106a and the sample positioning controller 106b. For example, the master controller 106c may be configured to generate one or more control signals configured to cause the image processing controller 106a to perform image processing (or capture images) in response to one or more received signals from the sample positioning controller 106b. By way of another example, the master controller 106c may be configured to generate one or more control signals configured to cause the sample positioning controller 106b to perform stage position correction in response to received signals from the image processing controller 106a. In this regard, the master controller 106c may be configured to receive an image of the sample 112 captured by the imaging detector 102 from the image processing controller 106a and a sample stage location ($x_0$, $y_0$) from the sample positioning controller 106b. The image processing controller 106a may then be configured to determine the actual location of the sample stage ($x_{actual}$, $y_{actual}$) and generate one or more vector correction signals ($d_x$, $d_y$) to send to the master controller 106c. The master controller 106c may then send the generated control signals to the sample positioning controller 106b to adjust the location of the sample stage 104 while in movement.

In one embodiment, the one or more controllers 106 are configured to receive a current position of a field of view of the imaging detector 102 on the sample mounted to the sample stage 104. For example, the image processing controller 106a may be configured to receive a current position of a field of view of the imaging detector 102 on the sample mounted to the sample stage 104.

In another embodiment, the one or more controllers 106 are configured to receive a target position of the sample mounted on the sample stage 104. For example, the target position may be determined prior to measurement (e.g., prior to runtime), such that the system 100 may be configured to learn (during the training process) how the targets on route appear before actual measurements are performed.

In another embodiment, the one or more controllers 106 are configured to receive locations of one or more reference features along a path between a current position and the target position. For example, the sample 112 may include one or more reference features (e.g., markings) on a surface of the sample 112. For instance, the one or more reference features of the sample 112 may be used as physical encoders to determine the location of the sample stage 104 during processing. It is noted herein that the one or more reference features may be set during the characterization recipe train.

In another embodiment, the one or more controllers 106 are configured to direct the imaging detector 102 to capture images of the one or more reference features along the path. For example, the image processing controller 106a may be configured to direct the imaging detector 102 to capture images of the one or more reference features along the path.

In another embodiment, the one or more controllers 106 are configured to direct the sample stage 104 to translate the sample 112 along the path. For example, the sample positioning controller 106b may be configured to direct the sample stage 104 to translate the sample 112 mounted to the sample stage 104 along the path.

In another embodiment, the one or more controllers 106 are configured to determine one or more positioning errors of the sample stage 104 along the path based on the one or more images of the one or more reference features along the path. For example, the one or more controllers 106 may be configured to calculate the difference between the target position of the sample stage 104 and the actual position of the sample stage 104 to determine the one or more positioning errors of the sample stage 104. In one instance, the image processing controller 106a may be configured to compare one or more images of the one or more reference features captured along the path to calculate the difference between the target position and the actual position of the sample stage 104. In another instance, a master controller 106c may be configured to receive the one or more processed images from the image processing controller 106a such that the master controller 106c may be configured to compare one or more images of the one or more reference features captured along the path to calculate the difference between the target position and the actual position of the sample stage 104. It is noted herein that the one or more controllers 106 of the sample positioning system 100 may be configured to calculate the difference before the sample stage 104 reaches the final target stage position.

In another embodiment, the one or more controllers 106 are configured to adjust one or more correctables of the sample positioning system 100. For example, the one or more controllers 106 may be configured to receive the positioning errors of the sample stage 104. In one instance, the sample positioning controller 106b may be configured to receive the positioning errors from at least one of the image processing controller 106a or the master controller 106c and adjust a velocity of the sample stage 104 based on the received positioning errors. In another instance, the sample positioning controller 106b may be configured to receive the positioning errors from at least one of the image processing controller 106a or the master controller 106c and adjust the path to the target location based on the received positioning errors.

Although FIGS. 1A-1C depict specific controller configurations, it is noted herein FIGS. 1A-1C are provided merely for illustrative purposes and that the sample positioning system 100 may include various controller configurations without departing from the scope of the present disclosure. For example, the sample positioning system 100 may include an imaging detector 102 with an internal image processing controller 106a and a sample stage 104 with an off-board sample positioning controller 106b. In this regard, the internal image processing controller 106a may be configured to directly communicatively couple to the off-board sample positioning controller 106b. In another regard, the internal image processing controller 106a may couple to a master controller 106c that is configured to couple to the off-board sample positioning controller 106b.

By way of another example, the sample positioning system 100 may include an imaging detector 102 with an internal image processing controller 106a and a sample stage 104 with an internal sample positioning controller 106b. In this regard, the internal image processing controller 106a may be configured to directly communicatively couple to the internal sample positioning controller 106b. In another regard, the internal image processing controller 106a may couple to a master controller 106c that is configured to couple to the internal sample positioning controller 106b.

By way of another example, the sample positioning system 100 may include an imaging detector 102 with an off-board image processing controller 106a and a sample stage 104 with an off-board sample positioning controller. In this regard, the off-board image processing controller 106a may be configured to directly communicatively couple to the off-board sample positioning controller 106b. In another regard, the off-board image processing controller 106a may couple to a master controller 106c that is configured to couple to the off-board sample positioning controller 106b.

By way of another example, the sample positioning system 100 may include an imaging detector 102 with an off-board image processing controller 106a and a sample stage 104 with an off-board sample positioning controller. In this regard, the off-board image processing controller 106a may be configured to directly communicatively couple to the off-board sample positioning controller 106b. In another regard, the off-board image processing controller 106a may couple to a master controller 106c that is configured to couple to the off-board sample positioning controller 106b. By way of another example, the sample positioning system 100 may include a controller 106 configured to perform image processing and sample positioning correction.

Figure 2:
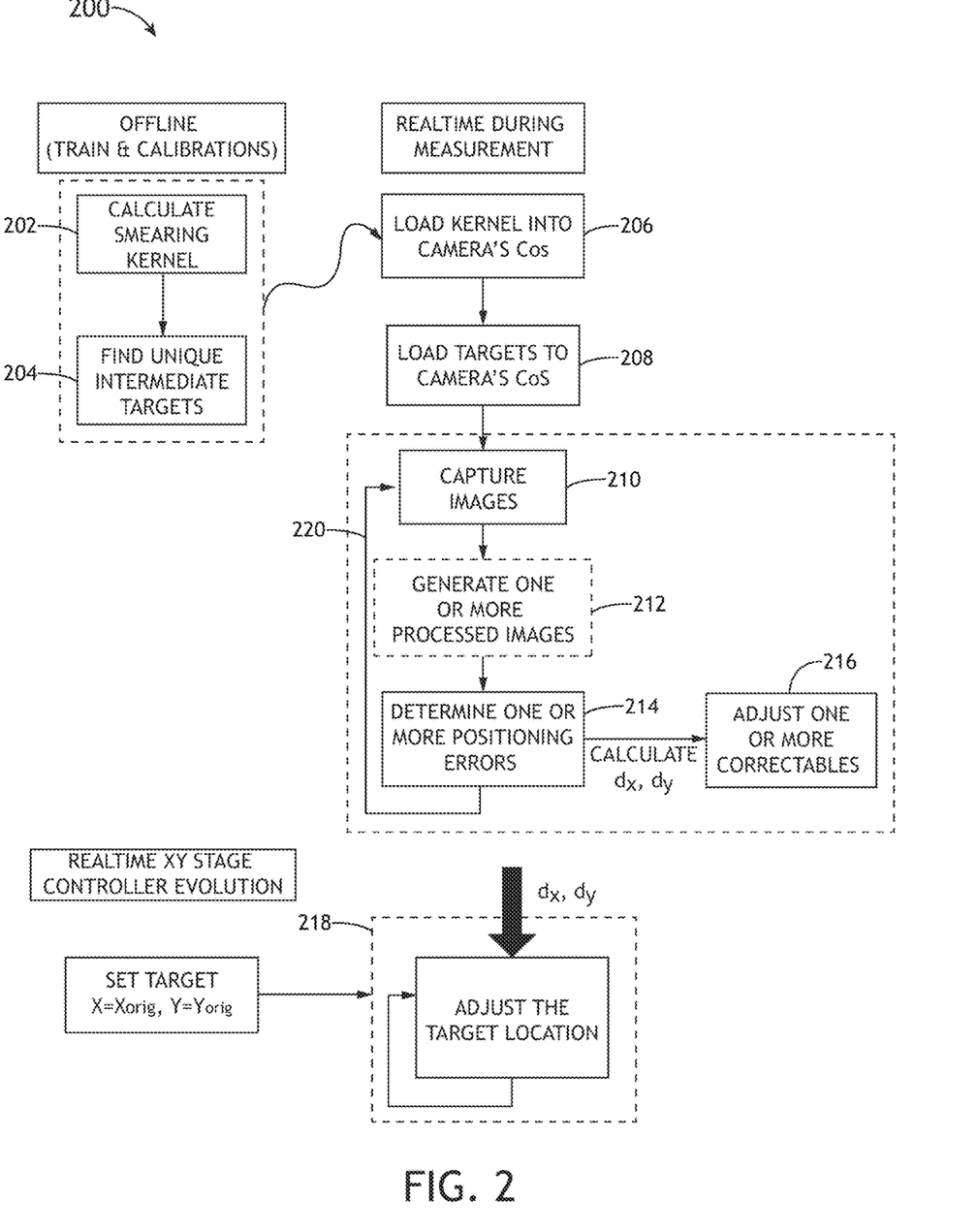
FIG. 2 illustrates a simplified schematic flow diagram of a sample positioning method, in accordance with one or more embodiments of the present disclosure.

FIG. 2 illustrates a simplified schematic flow diagram of a sample positioning method 200, in accordance with one or more embodiments of the present disclosure.

In one embodiment, the sample positioning system 100 is configured to determine a smearing kernel (step 202). For example, the system 100 may be configured to determine a smearing kernel as a function of movement parameters (e.g., velocity, acceleration, jerk, and the like) in the x- and y-direction and the optical configuration. In another embodiment, the sample positioning system 100 is configured to perform convolution between the smearing kernel and the one or more images captured by the imaging detector 102 (in step 210).

In another embodiment, the sample positioning system 100 is configured to find unique intermediate targets (step 204). For example, the unique intermediate targets (e.g., reference feature) may be found during the training process (e.g., prior to runtime) using one or more uniqueness metrics. It is noted herein that the one or more unique targets (reference features) may be found using any uniqueness metric known in the art suitable for determining how many features there are in an image including, but not limited to, high pass filter, blob detection, and the like.

It is noted herein that steps 202 and 204 may be performed offline and during training (e.g., prior to run time).

In another embodiment, the sample positioning system 100 is configured to load the smearing kernel determined in step 202 into the imaging detector's system-on-chip (SoC) (step 206). In another embodiment, the sample positioning system 100 is configured to load the unique intermediate targets determined in step 204 into the imaging detector's SoC (step 208). The smearing kernel and/or the unique intermediate targets (reference features) may be loaded into the SoC either as a piece of software or in hardware (e.g., a field-programmable gate array (FPGA), or the like).

In another embodiment, the sample positioning system 100 is configured to direct the imaging detector 102 to capture one or more images of the one or more reference features (step 210). For example, the one or more controllers 106 may be configured to generate one or more controls signals to direct the imaging detector 102 to capture one or more images.

In some embodiment, the sample positioning system 100 is configured to generate one or more processed images of the images captured in step 210 (step 212). For example, the one or more controllers 106 may be configured to perform image enhancement and image registration. For instance, the one or more controllers 106 may be configured to apply an anti-smearing filter to the one or more images to generate the one or more processed images.

Figure 3:
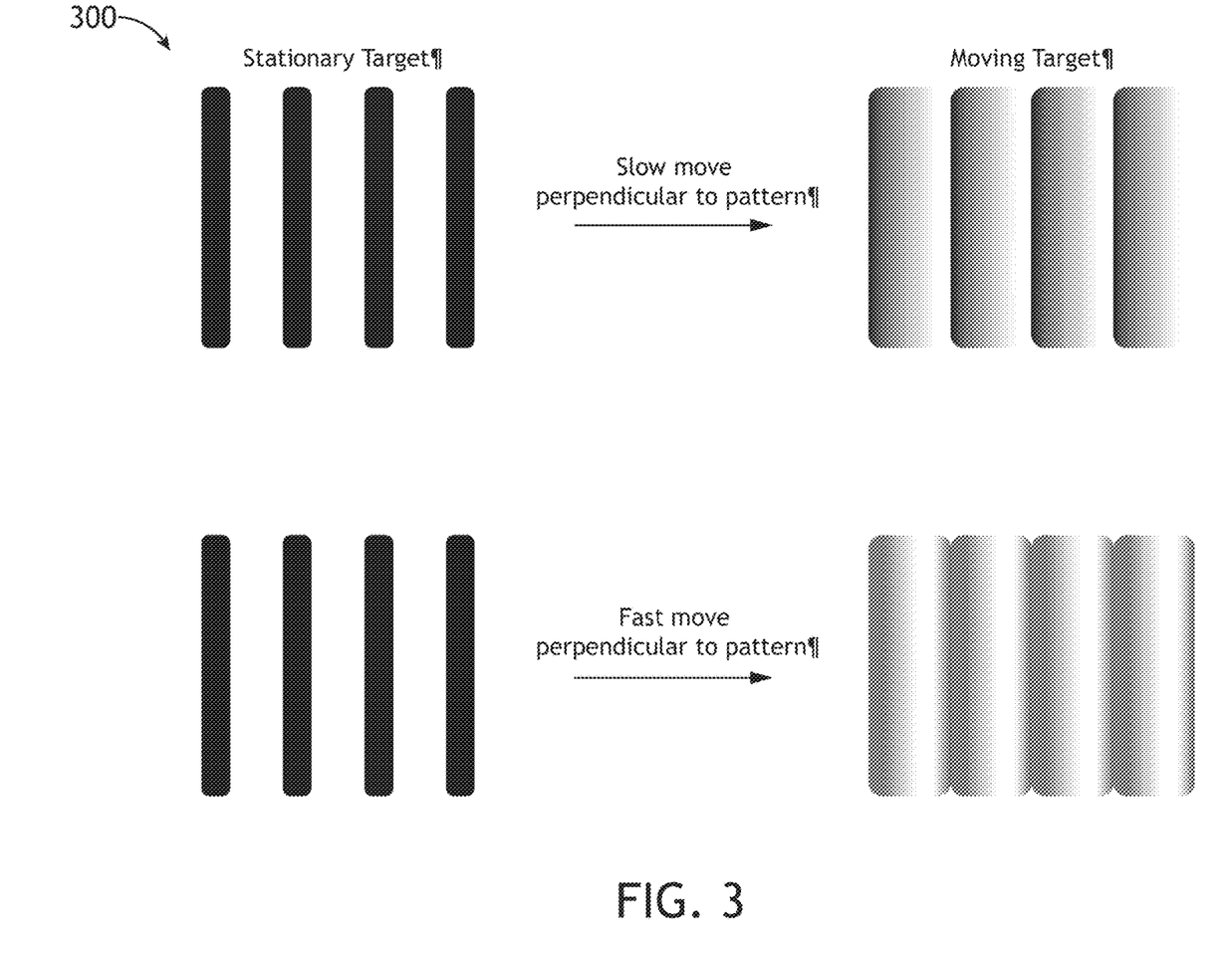
FIG. 3 illustrates the relationship between smearing amplitude and stage movement, in accordance with one or more embodiments of the present disclosure.

FIG. 3 illustrates the relationship between smearing amplitude and stage movement, in accordance with one or more embodiments of the present disclosure. In particular, FIG. 3 illustrates that an increase in the velocity of the stage leads to an increase in smearing amplitude. It is noted herein that a smearing amplitude above a select threshold may adversely impact image processing and may make it difficult for the sample positioning system to accurately determine positioning errors of the sample stage. As such, the sample positioning system 100 may be configured to adjust one or more correctables of the system 100 to provide a smearing length below the select threshold. The smearing length may be determined using Equation 1, which is shown and described as:

$$D[pix] = \frac{t \cdot v}{s} = \frac{d}{s} \qquad \text{Eqn. 1}$$

where t is the integration time of the imaging detector (miliseconds), v is the velocity of the sample stage in one direction (μ/s), s is the pixel size (μ), and d is the distance covered by the sample stage during the integration time t (μ).

In one embodiment, the one or more controllers 106 of the system 100 may be configured to adjust at least one of a velocity of the sample stage (v) or an integration time of the imaging detector (t) to provide a smearing length below a select threshold. For example, the at least one of the velocity of the sample stage or the integration time of the imaging detector may be adjusted such that the smearing length is ten pixels. By way of another example, the at least one of the velocity of the sample stage or the integration time of the imaging detector may be adjusted such that the smearing length is nine pixels. By way of a further example, the at least one of the velocity of the sample stage or the integration time of the imaging detector may be adjusted such that the smearing length is five pixels. By way of a further example, the at least one of the velocity of the sample stage or the integration time of the imaging detector may be adjusted such that the smearing length is fifteen pixels. By way of a further example, the at least one of the velocity of the sample stage or the integration time of the imaging detector may be adjusted such that the smearing length is 100 pixels.

In some embodiments, the select threshold may be a selected fraction of a period of the one or more sets of periodic features along the path.

In another embodiment, the sample positioning system 100 is configured to determine positioning errors of the sample stage 104 (step 214). For example, the one or more controllers 106 may be configured to determine one or more positioning errors of the sample stage 104. For instance, the one or more controllers 106 may be configured to calculate the difference between the target position of the sample stage 104 and the actual position of the sample stage 104 to determine the one or more positioning errors of the sample stage 104.

In some embodiments, the sample positioning system 100 is configured to determine one or more positioning errors of the sample stage 104 based on the one or more processed images generated in step 212. For example, after the anti-smearing filter has been applied to the one or more images of the one or more reference features, the one or more controllers 106 may be configured to calculate the difference between the target position and actual position of the sample stage 104 based on the processed images.

In another embodiment, the sample positioning system 100 is configured to adjust one or more correctables (e.g., $d_x$, $d_y$) of the system 100 based on the one or more positioning errors (steps 216). For example, the one or more controllers 106 may be configured to adjust the velocity of the sample stage 104 based on the positioning errors. By way of another example, the one or more controllers 106 may be configured to adjust the path of the sample stage 104 based on the positioning errors.

In another embodiment, the sample positioning system 100 is configured to adjust a target position based on the positioning errors during translation (step 218). In a non-limiting example, if the initial target is set at $x_0,y_0$, and the system 100 (e.g., the image processing controller 106a) receives a correction vector (e.g., $dx_1,dy_1$) then the stage target will be adjusted to $\{x_0+dx_1,y_0+dy_1\}$. Continuing with the non-limiting example, after the next image calculation is determined (e.g., $dx_2$, $dy_2$), the target will be adjusted to $\{x_0+dx_1+dx_2,y_0+dy_1+dy_2\}$, and so on.

In another embodiment, the positioning accuracy of the sample stage at the target positioning is based on a resolution of the imaging detector.

It is noted herein that steps, 210, 212, and 214 may form a closed loop feedback 220. In this regard, the closed loop feedback may be used to calculate the positioning errors of the sample stage 104 while the sample is moving and before movement ends. The difference between the current position and the target position may be calculated before movement ends. Further, it is noted herein that steps 206-216 may be performed during real-time measurement (e.g., runtime).

Figure 4:
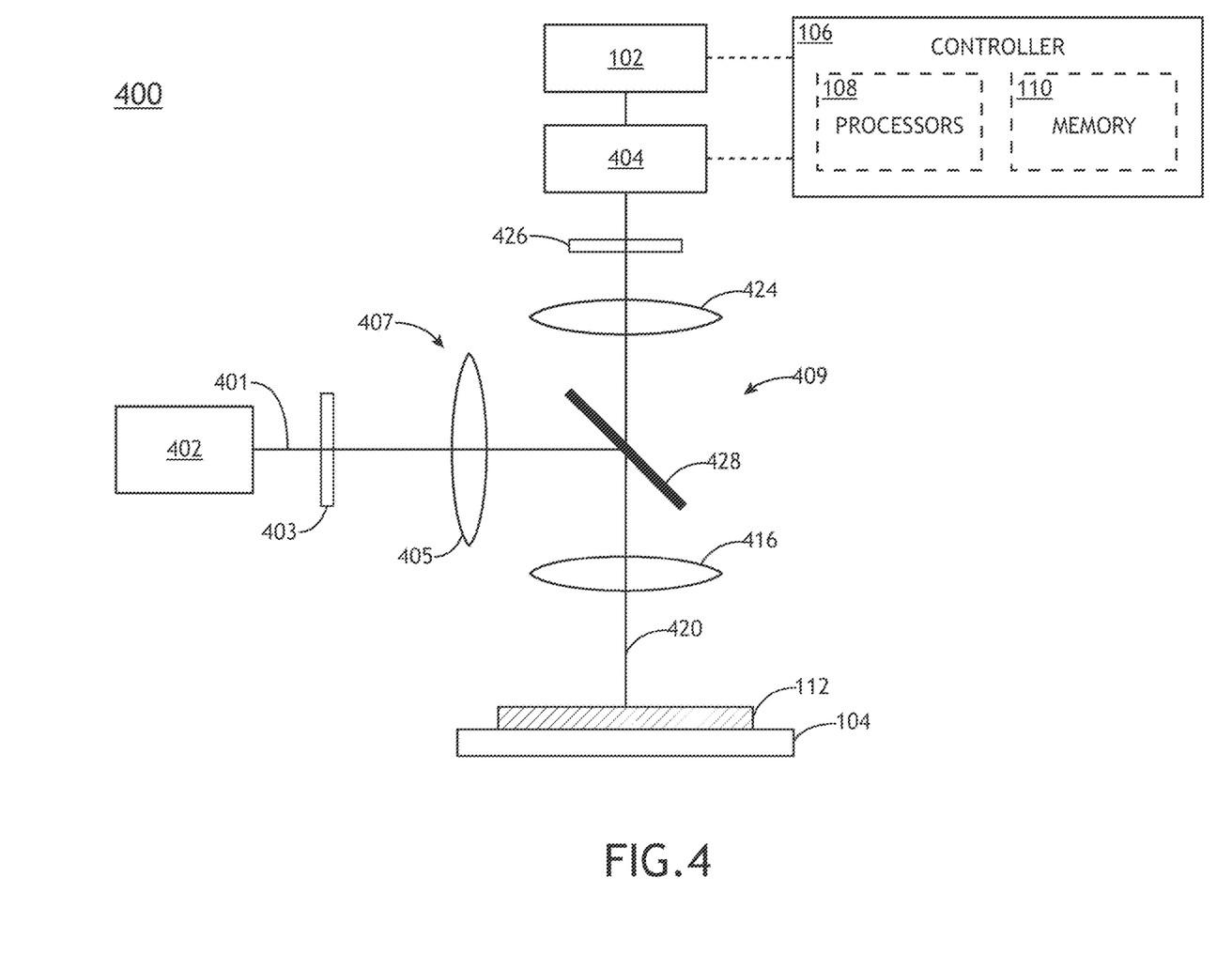
FIG. 4 illustrates a simplified schematic view of a characterization system including the sample positioning system, in accordance with one or more embodiments of the present disclosure.

FIG. 4 illustrates a simplified schematic view of a characterization system 400, in accordance with one or more embodiments of the present disclosure. It is noted herein that the characterization system 400 may include, but is not limited to, an inspection system or a metrology system. For the purposes of the present disclosure, it is noted herein that the characterization system 400 may be referred to as a characterization tool. Likewise, a metrology system may be referred to as a metrology tool, and an inspection system may be referred to as an inspection tool. The characterization system 400 may include any inspection system known in the art including, but not limited to, an optical-based inspection tool, a charged particle-based inspection tool, review tool, and the like. The characterization system 400 may include any metrology system known in the art including, but not limited to, an imaging-based metrology system, a scatterometry-based metrology system, and the like.

In one embodiment, the characterization system 400 includes the sample positioning system 100. The sample positioning system 100 may include, but is not limited to, an imaging detector 102, a sample stage 104 configured to mount a sample 112, and one or more controllers 106 communicatively coupled to the imaging detector 102 and the sample stage 104. For example, the sample positioning system 100 of the characterization system 400 may be configured to use the sample 112 as a large-scale encoder for closed loop feedback of the sample stage 104 of the characterization system using images captured from the imaging detector 102.

In another embodiment, the imaging detector 102 is configured to capture one or more images of the sample 112 mounted on the sample stage 104. For example, the imaging detector 102 may be configured to capture the one or more images of the sample at a target location when the sample is stationary. By way of another example, the imaging detector 102 may be configured to capture the one or more images of the sample at a target location when the sample is in motion (e.g., while the sample is on-route).

In another embodiment, the imaging detector 102 includes a fast camera configured to capture one or more images of the sample. For example, the imaging detector 102 may include a fast frame rate camera 102. By way of another example, the imaging detector 102 may include a fast differential camera 102.

In another embodiment, the sample stage 104 configured to translate the sample 112 mounted on the sample stage 104 in the x- and/or y-direction. It is noted herein that the sample stage 104 may be configured to translate the sample 112 mounted on the sample stage 104 in the x- and/or y-direction at a select velocity. For example, the sample stage 104 may be configured to translate the sample 112 mounted to the sample stage 104 at a velocity greater than 500 micrometers per second (μm/s). By way of another example, the sample stage 104 may be configured to translate the sample 112 mounted to the sample stage 104 at a velocity greater than 900 μm/s.

In one embodiment, the characterization system 400 includes an illumination source 402 configured to generate an illumination beam 401. The illumination source 402 may include any illumination source known in the art suitable for generating an illumination beam 401. For example, the illumination source 402 may emit near infrared (NIR) radiation, visible radiation, ultraviolet (UV) radiation, near UV (NUV), deep UV (DUV) radiation, vacuum UV (VUV) radiation, and the like. For instance, the illumination source 402 may include one or more lasers. In another instance, the illumination source 402 may include a broadband illumination source. In some embodiments, the illumination source 402 includes the same illumination source of the lighting sub-system of the sample positioning system 100.

In some embodiments, the characterization system 400 includes a light sub-system for image acquisition. For example, the light sub-system may be configured to allow a select amount of light in for image acquisition. In one instance, the exposure time of the imaging detector 102 may be less than 2 milliseconds (ms). In another instance, the exposure time of the imaging detector 102 may be less than 1 ms. In a further instance, the exposure time of the imaging detector 102 may be less than 0.05 ms. In a further instance, the exposure time of the imaging detector 102 may be less than 10.0 ms. In a further instance, the exposure time of the imaging detector 102 may be less than 5.0 ms. In this regard, the select amount of light (e.g., the exposure time of the imaging detector 102) may result in high quality images and allow for quantitative image processing.

In another embodiment, the characterization system 400 includes an illumination arm 407 configured to direct illumination from the illumination source 402 to the sample 112. The illumination arm 407 may include any number and type of optical components known in the art. In one embodiment, the illumination arm 407 includes one or more optical elements 403. In this regard, illumination arm 407 may be configured to focus illumination from the illumination source 402 onto the surface of the sample 112. It is noted herein that the one or more optical elements 403 may include any optical element known in the art including, but not limited to, an objective lens 405, one or mirrors, one or more lenses, one or more polarizers, one or more beam splitters, or the like.

In another embodiment, a collection arm 409 is configured to collect illumination 420 reflected, scattered, diffracted, and/or emitted from the sample 112. In another embodiment, the collection arm 409 may direct and/or focus the illumination from the sample 112 to a detector assembly 404. It is noted herein that the detector assembly 404 may include any detector assembly 404 known in the art. The sensor may include, but is not limited to, charge-coupled device (CCD detector), a complementary metal oxide semiconductor (CMOS) detector, a time-delay integration (TDI) detector, a photomultiplier tube (PMT), an avalanche photodiode (APD), a line sensor, an electron-bombarded line sensor, or the like.

In some embodiments, the detector 404 includes imaging detector 102 of the sample positioning system 100.

In another embodiment, the collection arm 409 may further include any number of collection optical components 426 to direct and/or modify illumination collected by the objective lens 416 including, but not limited to one or more collection pathway lenses 424, one or more filters, one or more polarizers, or one or more beam blocks. Additionally, the collection arm 409 may include field stops to control the spatial extent of the sample imaged onto the detector 404 or aperture stops to control the angular extent of illumination from the sample used to generate an image on the detector 404. In another embodiment, the collection arm 409 includes an aperture stop located in a plane conjugate to the back focal plane of an optical element of the objective lens 416 to provide telecentric imaging of the sample.

In another embodiment, the characterization system 400 includes a beamsplitter 428 oriented such that the objective lens 416 may simultaneously direct the illumination beam 401 to the sample 112 and collect radiation emanating from the sample 112.

In another embodiment, the one or more controllers 106 include one or more processors 108 and memory 110. For example, the one or more processors 108 may be configured to execute a set of program instructions maintained in a memory device 110 (memory 110). The one or more processors 108 of the one or more controllers 106 may include any processing element known in the art. In this sense, the one or more processors 108 may include any microprocessor-type device configured to execute algorithms and/or instructions. Further, the memory device 110 may include any storage medium known in the art suitable for storing program instructions executable by the associated one or more processors 108. For example, the memory device 110 may include a non-transitory memory medium. As an additional example, the memory device 110 may include, but is not limited to, a read-only memory, a random access memory, a magnetic or optical memory device (e.g., disk), a magnetic tape, a solid state drive and the like.

In one embodiment, the one or more controllers 106 are configured to receive a current position of a field of view of the imaging detector 102 on the sample mounted to the sample stage 104. In another embodiment, the one or more controllers 106 are configured to receive locations of one or more reference features along a path between a current position and the target position. In another embodiment, the one or more controllers 106 are configured to direct the imaging detector 102 to capture images of the one or more reference features along the path. In another embodiment, the one or more controllers 106 are configured to direct the sample stage 104 to translate the sample 112 along the path. In another embodiment, the one or more controllers 106 are configured to determine one or more positioning errors of the sample stage 104 along the path based on the one or more images of the one or more reference features along the path. In another embodiment, the one or more controllers 106 are configured to adjust one or more correctables of the sample positioning system 100.

In another embodiment, the one or more controllers 106 are configured to receive data including, but not limited to, characterization data associated with the sample 112 from the detector 404.

The one or more processors 108 of one or more controllers 106 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 132 may include any device configured to execute algorithms and/or instructions (e.g., program instructions stored in memory). In one embodiment, the one or more processors 132 may be embodied as a desktop computer, mainframe computer system, workstation, image computer, parallel processor, networked computer, or any other computer system configured to execute a program configured to operate or operate in conjunction with the system 100 or system 400, as described throughout the present disclosure.

Moreover, different subsystems of the system 100, 400, may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into metrology system 100. Further, the controller 106 may analyze data received from the detector 102, 404 and feed the data to additional components within the system 100, 400 or external to the system 100, 400.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory (ROM), a random-access memory (RAM), a magnetic or optical memory device (e.g., disk), a magnetic tape, a solid-state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like).

In another embodiment, the one or more controllers 106 are communicatively coupled to one or more elements of the system 100, 400. In this regard, the one or more controllers 106 may transmit and/or receive data from any component of the system 100, 400. Further, the one or more controllers 106 may direct or otherwise control any component of the system 100, 400 by generating one or more drive signals for the associated components. For example, the one or more controllers 106 may be communicatively coupled to the detector 102, 404 to receive one or more images from the detector 102, 404.

Figure 5:
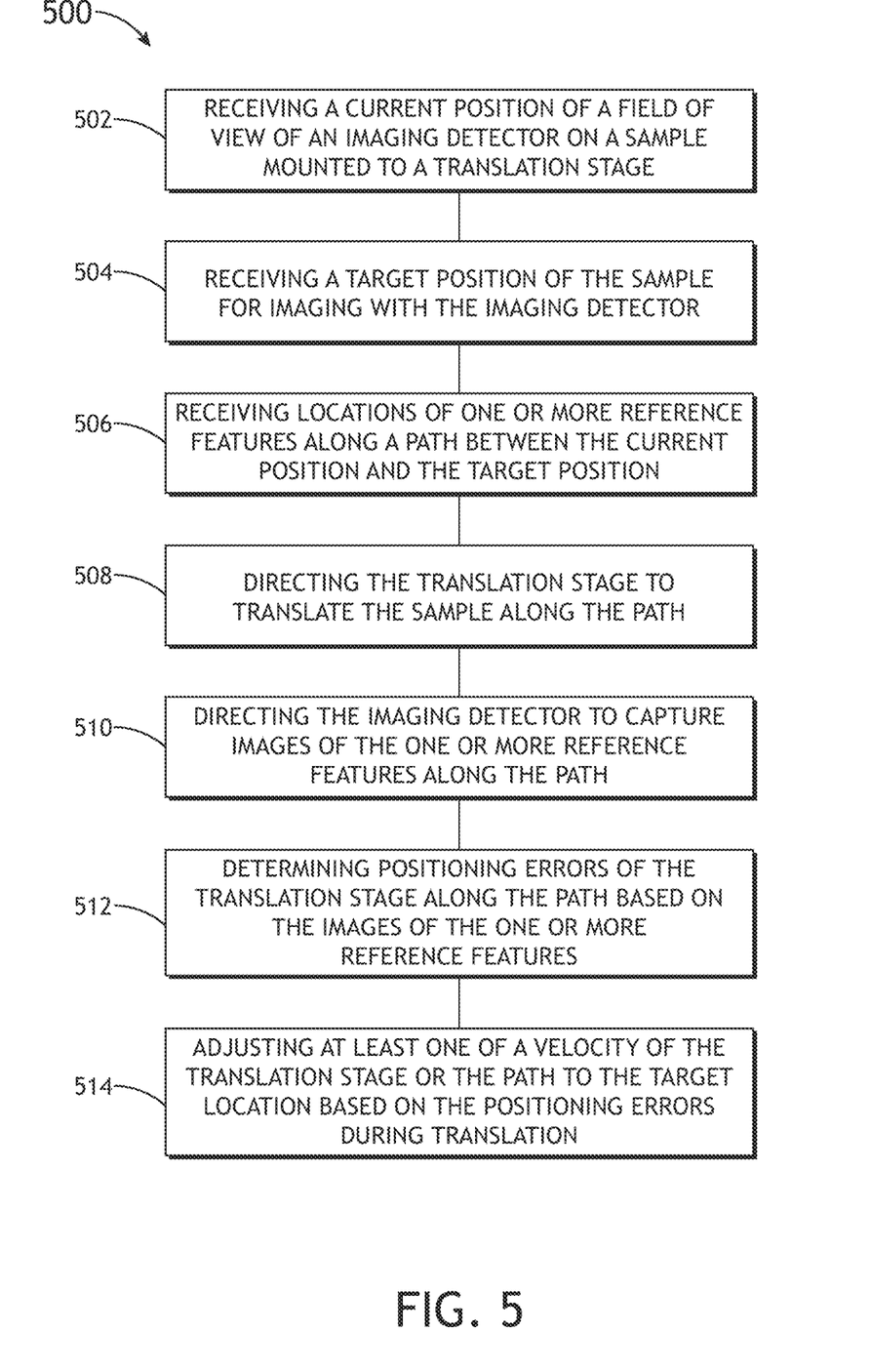
FIG. 5 illustrates a flowchart depicting a sample positioning method, in accordance with one or more embodiments of the present disclosure.

FIG. 5 illustrates a flowchart depicting a method 500 for sample positioning, in accordance with one or more embodiments of the present disclosure. It is noted herein that the steps of method 500 may be implemented all or in part by system 100. It is further recognized, however, that the method 500 is not limited to the system 100 in that additional or alternative system-level embodiments may carry out all or part of the steps of method 500.

In one embodiment, the sample positioning method 500 includes a step 502 of receiving a current position of a field of view of an imaging detector on a sample mounted to a sample stage. For example, the one or more controllers 106 (e.g., the image processing controller 106a) may be configured to receive a current position of the field of view the imaging detector 102 on the sample mounted to the sample stage 104. As previously discussed herein, the system 100 may include any fast camera known in the art. For example, the system 100 may include a fast frame rate camera. By way of another example, the system 100 may include a fast differential camera.

In another embodiment, the sample positioning method 500 includes a step 504 of receiving a target position of the sample for imaging with the imaging detector.

In another embodiment, the sample positioning method 500 includes a step 506 of receiving locations of one or more reference features along a path between the current position and the target position. For example, the sample 112 may include one or more reference features (e.g., markings) on a surface of the sample 112. For instance, the one or more reference features of the sample 112 may be used as physical encoders to determine the location of the stage during processing.

In another embodiment, the sample positioning method 500 includes a step 508 of directing the sample stage to translate the sample along the path. For example, the one or more controllers 106 (e.g., the sample positioning controller 106b) communicatively coupled to the sample stage 104 may be configured to generate one or more control signals configured to cause the sample stage 104 to translate the sample 112 mounted on the stage 104 a select amount in the x- and/or y-direction. For instance, the one or more controllers 106 (e.g., the sample positioning controller 106b) may be configured to generate the one or more control signals configured to cause the sample stage to translate the sample 112 in response to one or more control signals received from the imaging detector 102 (e.g., the image processing controller 106a).

In another embodiment, the sample positioning method 500 includes a step 510 of directing the imaging detector 102 to capture images of the one or more reference features along the path. For example, the one or more controllers 106 communicatively coupled to the imaging detector 102 may be configured to generate one or more control signals to direct the imaging detector 102 to capture one or more images. In one instance, the image processing controller 106a may be configured to generate one or more control signals to direct the imaging detector 102 to capture one or more images. In another instance, the master controller 106c may be configured to generate one or more control signals to direct the imaging detector 102 to capture one or more images.

In another embodiment, the sample positioning method 500 includes a step 512 of determining positioning errors of the sample stage along the path based on the images of the one or more reference features. For example, the image processing controller 106a coupled to the imaging detector 102 may be configured to apply an anti-smearing filter to the images of the one or more features to generate one or more processed images. In this regard, the image processing controller 106a may be configured to determine positioning errors of the sample stage along the path based on the one or more processed images generated by the image processing controller 106a.

In one embodiment, the anti-smearing filter is generated based on images of one or more test features at one or more stage velocities prior to runtime.

In another embodiment, the sample positioning method 500 includes a step 514 of adjusting one or more correctables of the sample positioning system 100. For example, the one or more controllers 106 may be configured to adjust at least one of a velocity of the sample stage or the path to the target location based on the determined positioning errors during translation of step 512.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A sample positioning system, comprising:
   an imaging detector; and
   a controller communicatively coupled to the imaging detector and a sample stage, wherein the controller includes one or more processors configured to execute program instructions causing the one or more processors to:
      receive a current position of a field of view of the imaging detector on a sample mounted to the sample stage;
      receive a target position of the sample for imaging with the imaging detector;
      receive locations of one or more reference features along a path between the current position and the target position;
      direct the sample stage to translate the sample along the path;
      direct the imaging detector to capture one or more images of the one or more reference features along the path;
      determine positioning errors of the sample stage along the path based on the one or more images of the one or more reference features; and
      adjust at least one of a velocity of the sample stage or the path to the target location based on the positioning errors during translation, wherein a positioning accuracy of the sample stage at the target position is based on a resolution of the imaging detector.

2. The sample positioning system of claim 1, wherein the imaging detector includes a fast frame rate camera.

3. The sample positioning system of claim 1, wherein the imaging detector includes a fast differential camera.

4. The sample positioning system of claim 1, wherein the imaging detector captures the one or more images of the sample at the target location when the sample is stationary.

5. The sample positioning system of claim 1, wherein the imaging detector captures the one or more images of the sample at the target location when the sample is in motion.

6. The sample positioning system of claim 1, wherein a controller of the one or more controllers is integrated into the imaging detector.

7. The sample positioning system of claim 1, wherein a controller of the one or more controllers is external to the imaging detector.

8. The sample positioning system of claim 1, wherein determine positioning errors of the sample stage along the path based on the one or more images of the one or more reference features comprises:
   apply an anti-smearing filter to the one or more images of the one or more reference features to generate one or more processed images; and
   determine positioning errors of the sample stage along the path based on the one or more processed images.

9. The sample positioning system of claim 8, wherein the anti-smearing filter is generated based on one or more images of one or more test features at one or more stage velocities prior to runtime.

10. The sample positioning system of claim 1, wherein at least one of a velocity of the sample stage or an integration time of the imaging detector during runtime is adjusted to provide a smearing length below a selected threshold.

11. The sample positioning system of claim 10, wherein the selected threshold comprises:
    ten pixels.

12. The sample positioning system of claim 10, wherein the selected threshold comprises:
    nine pixels.

13. The sample positioning system of claim 10, wherein the one or more reference features comprise:
    one or more sets of periodic features oriented with a periodicity along the path, wherein the selected threshold comprises:
        a selected fraction of a period of the one or more sets of periodic features along the path.

14. The sample positioning system of claim 1, wherein adjust at least one of a velocity of the sample stage or the path to the target location based on the positioning errors during translation comprises:
    adjust the target position based on the positioning errors during translation.

15. The sample positioning system of claim 1, wherein an exposure time of the imaging detector is less than 2 milliseconds.

16. The sample positioning system of claim 1, wherein an exposure time of the imaging detector is less than 1 milliseconds.

17. The sample positioning system of claim 1, wherein an exposure time of the imaging detector is less than 0.05 milliseconds.

18. The sample positioning system of claim 1, wherein a velocity of the sample stage is greater than 500 micrometers per second.

19. The sample positioning system of claim 1, wherein a velocity of the sample stage is greater than 900 micrometers per second.

20. A characterization system, comprising:
an imaging detector;
a sample stage for securing a sample; and
a controller communicatively coupled to the imaging detector and the sample stage, wherein the controller includes one or more processors configured to execute program instructions causing the one or more processors to:
receive a current position of a field of view of the imaging detector on the sample mounted to the sample stage;
receive a target position of the sample for imaging with the imaging detector;
receive locations of one or more reference features along a path between the current position and the target position;
direct the sample stage to translate the sample along the path;
direct the imaging detector to capture one or more images of the one or more reference features along the path;
determine positioning errors of the sample stage along the path based on the one or more images of the one or more reference features; and
adjust at least one of a velocity of the sample stage or the path to the target location based on the positioning errors during translation, wherein a positioning accuracy of the sample stage at the target position is based on a resolution of the imaging detector, wherein the imaging detector captures an image of the sample at the target location.

21. The characterization system of claim 20, wherein the imaging detector captures the image of the sample at the target location when the sample is stationary.

22. The characterization system of claim 20, wherein the imaging detector captures the image of the sample at the target location when the sample is in motion.

23. The characterization system of claim 20, wherein the imaging detector includes a fast frame rate camera.

24. The characterization system of claim 20, wherein the imaging detector includes a fast differential camera.

25. The characterization system of claim 20, wherein a controller of the one or more controllers is integrated into the imaging detector.

26. The characterization system of claim 20, a controller of the one or more controllers is external to the imaging detector.

27. The characterization system of claim 20, wherein determine positioning errors of the sample stage along the path based on the one or more images of the one or more reference features comprises:
apply an anti-smearing filter to the one or more images of the one or more reference features to generate one or more processed images; and
determine positioning errors of the sample stage along the path based on the one or more processed images.

28. The characterization system of claim 27, wherein the anti-smearing filter is generated based on one or more images of one or more test features at one or more stage velocities prior to runtime.

29. The characterization system of claim 20, wherein at least one of a velocity of the sample stage or an integration time of the imaging detector during runtime is adjusted to provide a smearing length below a selected threshold.

30. The characterization system of claim 29, wherein the selected threshold comprises:
ten pixels.

31. The characterization system of claim 29, wherein the selected threshold comprises:
nine pixels.

32. The characterization system of claim 20, wherein the one or more reference features comprise:
one or more sets of periodic features oriented with a periodicity along the path, wherein the selected threshold comprises:
a selected fraction of a period of the one or more sets of periodic features along the path.

33. The characterization system of claim 20, wherein adjust at least one of a velocity of the sample stage or the path to the target location based on the positioning errors during translation comprises:
adjust the target position based on the positioning errors during translation.

34. A sample positioning method comprising:
receiving a current position of a field of view of an imaging detector on a sample mounted to a sample stage;
receiving a target position of the sample for imaging with the imaging detector;
receiving locations of one or more reference features along a path between the current position and the target position;
directing the sample stage to translate the sample along the path;
directing the imaging detector to capture one or more images of the one or more reference features along the path;
determining positioning errors of the sample stage along the path based on the one or more images of the one or more reference features; and
adjusting at least one of a velocity of the sample stage or the path to a target location based on the positioning errors during translation, wherein a positioning accuracy of the sample stage at the target position is based on a resolution of the imaging detector.

35. The sample positioning method of claim 34, wherein determining positioning errors of the sample stage along the path based on the one or more images of the one or more reference features comprises:
applying an anti-smearing filter to the one or more images of the one or more reference features to generate one or more processed images; and
determining positioning errors of the sample stage along the path based on the one or more processed images.

36. The sample positioning method of claim 35, further comprising:
generating the anti-smearing filter based on one or more images of one or more test features at one or more stage velocities prior to runtime.

37. The sample positioning method of claim 34, further comprising:

adjusting at least one of a velocity of the sample stage or an integration time of the imaging detector during runtime to provide a smearing length below a selected threshold.

38. The sample positioning method of claim 37, wherein the selected threshold comprises:

nine pixels.

39. The sample positioning method of claim 34, wherein the imaging detector includes a fast frame rate camera.

40. The sample positioning method of claim 34, wherein the imaging detector includes a fast differential camera.

* * * * *